United States Patent
Matsumoto

(10) Patent No.: US 7,089,479 B2
(45) Date of Patent: Aug. 8, 2006

(54) LDPC CODE INSPECTION MATRIX GENERATION METHOD AND INSPECTION MATRIX GENERATION DEVICE

(75) Inventor: Wataru Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 154 days.

(21) Appl. No.: 10/482,815

(22) PCT Filed: Feb. 28, 2003

(86) PCT No.: PCT/JP03/02331

§ 371 (c)(1),
(2), (4) Date: Jan. 5, 2004

(87) PCT Pub. No.: WO03/073621

PCT Pub. Date: Sep. 4, 2003

(65) Prior Publication Data
US 2004/0199859 A1    Oct. 7, 2004

(30) Foreign Application Priority Data
Feb. 28, 2002  (JP) .............................. 2002-053888

(51) Int. Cl.
*H03M 13/00* (2006.01)
(52) U.S. Cl. ....................... 714/758; 714/801
(58) Field of Classification Search ................ 714/758, 714/801
See application file for complete search history.

(56) References Cited

U.S. PATENT DOCUMENTS

| | | | | |
|---|---|---|---|---|
| 6,307,487 B1 * | 10/2001 | Luby | ........................... | 341/50 |
| 6,567,465 B1 * | 5/2003 | Goldstein et al. | ........... | 375/222 |
| 6,614,366 B1 * | 9/2003 | Luby | ........................... | 341/50 |
| 6,757,122 B1 * | 6/2004 | Kuznetsov et al. | ........... | 360/53 |
| 6,789,227 B1 * | 9/2004 | De Souza et al. | .......... | 714/804 |

FOREIGN PATENT DOCUMENTS

EP    1 460 766 A1    9/2004

OTHER PUBLICATIONS

Jilei et al, IEEE GLOBECOM'01 Global Telecommunications Conference, 2001, vol. 2, pp. 1016-1020.
Ludy et al, IEEE Transactions Information Theory, vol. 47, No. 2, pp. 585-598.

(Continued)

*Primary Examiner*—Albert Decady
*Assistant Examiner*—Mujtaba K. Chaudry
(74) *Attorney, Agent, or Firm*—Birch, Stewart, Kolasch & Birch, LLP

(57) ABSTRACT

A method of generating check matrixes for Low-Density Parity-Check codes includes determination steps of determining a maximum value of a column weight, basic Euclid geometric codes, and a coding rate respectively; a weight searching step of searching an optimum ensemble of a row weight and a column weight at one time according to a linear programming method in a state of a fixed coding rate, and so as to maximize a Gaussian noise; an information calculation step of calculating an information length based on a predetermined block length and the coding rate; a row deletion step of deleting a predetermined row based on the information length using the Euclid geometric codes; and a division step of dividing at random a row or a column of the matrixes after the row deletion in a predetermined order.

15 Claims, 25 Drawing Sheets

OTHER PUBLICATIONS

Sason et al, IEEE Communications Letters, vol. 4. No. 3 .pp. 89-91.

Sason et al, IEEE Transactions on Information Theory, vol. 47, No. 6, pp. 2275-2299.

Chung et al, IEEE Transactions on Information Theory, vol. 47, No. 2, pp. 657-670.

Sae-Young Chung et al., "Analysis of Sum-Product Decoding of Low-Density Parity-Check Codes Using a Gaussian Approximation" *IEEE Transactions on Information Theory*, vol. 47, No. 2, pp. 657-670 (2001).

Yu Kou et al., "Low Density Parity Check Codes Based on Finite Geometrics: A Rediscovery" *ISIT*, p. 200 (2000).

Matsumoto and Imai, "Irregular extended Euclidean geometry low-density parity-check codes", Proceedings of Third International Symposium on Communication Systems Networks and Digital Signal Processing, [Online] (2002).

* cited by examiner

FIG.2

SATISFACTORY ENSEMBLE OF CODES WITH rate = 0.5

| $D_1$ | | 32 |
|---|---|---|
| Rate | | 0.5 |
| | X | $\lambda_x$ |
| | 2 | 0.179592 |
| | 3 | 0.147781 |
| | 6 | 0.177941 |
| | 7 | 0.000132 |
| | 8 | 0.00017 |
| | 25 | 0.01391 |
| | 26 | 0.440164 |
| | 31 | 0.001142 |
| | 32 | 0.039168 |
| | X | $\rho x$ |
| | 10 | 0.3125 |
| | 11 | 0.6875 |

$$Row(i,j) = \begin{array}{|c|c|c|c|}\hline 1 & 5 & 13 & 14 \\\hline 2 & 6 & 14 & 15 \\\hline 1 & 3 & 7 & 15 \\\hline 1 & 2 & 4 & 8 \\\hline 2 & 3 & 5 & 9 \\\hline 3 & 4 & 6 & 10 \\\hline 4 & 5 & 7 & 11 \\\hline 5 & 6 & 8 & 12 \\\hline 6 & 7 & 9 & 13 \\\hline 7 & 8 & 10 & 14 \\\hline 8 & 9 & 11 & 15 \\\hline 1 & 9 & 10 & 12 \\\hline 2 & 10 & 11 & 13 \\\hline 3 & 11 & 12 & 14 \\\hline 4 & 12 & 13 & 15 \\\hline\end{array}$$

FIG.5

REARRANGEMENT IN ASCENDING ORDER $$Row'(i,j) = \begin{array}{|c|c|c|c|}\hline 1 & 5 & 13 & 14 \\\hline 1 & 3 & 7 & 15 \\\hline 1 & 2 & 4 & 8 \\\hline 1 & 9 & 10 & 12 \\\hline 2 & 6 & 14 & 15 \\\hline 2 & 3 & 5 & 9 \\\hline 2 & 10 & 11 & 13 \\\hline 3 & 4 & 6 & 10 \\\hline 3 & 11 & 12 & 14 \\\hline 4 & 5 & 7 & 11 \\\hline 4 & 12 & 13 & 15 \\\hline 5 & 6 & 8 & 12 \\\hline 6 & 7 & 9 & 13 \\\hline 7 & 8 & 10 & 14 \\\hline 8 & 9 & 11 & 15 \\\hline\end{array}$$

FIG.6

DELETE LOWER FIVE ROWS $$\text{Row\_5'}(i,j) = \begin{array}{|c|c|c|c|} \hline 1 & 5 & 13 & 14 \\ \hline 1 & 3 & 7 & 15 \\ \hline 1 & 2 & 4 & 8 \\ \hline 1 & 9 & 10 & 12 \\ \hline 2 & 6 & 14 & 15 \\ \hline 2 & 3 & 5 & 9 \\ \hline 2 & 10 & 11 & 13 \\ \hline 3 & 4 & 6 & 10 \\ \hline 3 & 11 & 12 & 14 \\ \hline 4 & 5 & 7 & 11 \\ \hline \end{array}$$

FIG.7

| COLUMN NUMBER | NUMBER OF "1"S INCLUDED IN A COLUMN |
|---|---|
| 1 | 4 |
| 2 | 4 |
| 3 | 4 |
| 4 | 3 |
| 5 | 3 |
| 6 | 2 |
| 7 | 2 |
| 8 | 1 |
| 9 | 2 |
| 10 | 3 |
| 11 | 3 |
| 12 | 2 |
| 13 | 2 |
| 14 | 3 |
| 15 | 2 |

FIG.8

| dl | 4 | | |
|---|---|---|---|
| | X | $\lambda_x$ | No. |
| | 1 | 0.0250 | 1 |
| | 2 | 0.3000 | 6 |
| | 3 | 0.3750 | 5 |
| | 4 | 0.3000 | 3 |
| | X | $\rho x$ | No. |
| | 4 | 1 | 10 |

FIG.9

| dl | 32 | | |
|---|---|---|---|
| | X | $\lambda_x$ | No. |
| | 21 | 0.0016 | 2 |
| | 22 | 0.0272 | 33 |
| | 23 | 0.0646 | 75 |
| | 24 | 0.0989 | 110 |
| | 25 | 0.1733 | 185 |
| | 26 | 0.2309 | 237 |
| | 27 | 0.1791 | 177 |
| | 28 | 0.1007 | 96 |
| | 29 | 0.0467 | 43 |
| | 30 | 0.0112 | 10 |
| | 31 | 0.0070 | 6 |
| | 32 | 0.0588 | 49 |
| | X | $\rho x$ | No. |
| | 32 | 1 | 834 |

FIG.10

DIVISION TABLE

| 2x16 | 3x10 +2x1 | 6x5 +2x1 | 7x4 +2x2 | 8x4 | 25x1 +7x1 or 25x1 +2x2 +3x1 | 26x1 +6x1 or 26x1 +3x2 or 26x1 +2x3 | 32x1 |
|---|---|---|---|---|---|---|---|

FIG.11

| x | $\lambda_x$ | | | | | | | | x | $\lambda_x$ |
|---|---|---|---|---|---|---|---|---|---|---|
| 2 | 0.179592478 | 4792.964 | 2396.482 | 2396 | 4792 | 4792 | 2396 | 2 | 10 | 0.179556355 |
| 3 | 0.147780554 | 3943.967 | 1314.656 | 1315 | 3945 | 3942 | 1314 | 3 | 11 | 0.147706835 |
| 6 | 0.177941159 | 4748.894 | 791.4823 | 791 | 4746 | 4740 | 790 | 6 | | 0.177607914 |
| 7 | 0.000131985 | 3.522412 | 0.503202 | 1 | 7 | 0 | 0 | 7 | | 0 |
| 8 | 0.000169917 | 4.534747 | 0.566843 | 1 | 8 | 0 | 0 | 8 | | 0 |
| 25 | 0.013909921 | 371.228 | 14.84912 | 15 | 375 | 375 | 15 | 25 | | 0.014051259 |
| 26 | 0.440164354 | 11747.11 | 451.8118 | 452 | 11752 | 11752 | 452 | 26 | | 0.440347722 |
| 31 | 0.001141731 | 30.47051 | 0.98292 | 1 | 31 | 31 | 1 | 31 | | 0.001161571 |
| 32 | 0.039167902 | 1045.313 | 32.66603 | 33 | 1056 | 1056 | 33 | 32 | | 0.039568345 |
| | 1 | 26688 | 5004 | 5005 | 26712 | 26688 | 5001 | | | 1 |

| x | $\rho_x$ | | | | | | | | x | $\rho_x$ |
|---|---|---|---|---|---|---|---|---|---|---|
| 10 | 0.3125 | 8340 | 834 | 834 | 8340 | 8340 | 834 | 10 | | 0.3125 |
| 11 | 0.6875 | 18348 | 1668 | 1668 | 18348 | 18348 | 1668 | 11 | | 0.6875 |
| | 1 | 26688 | 2502 | 2502 | 26688 | 26688 | 2502 | | | 1 |

VARIABLE NODE (COLUMN)

CHECK NODE (ROW) TOTAL

| rate |
|---|
| 0.5 |
| 0.49970006 |

• TOTAL NUMBER OF "1S" WITHIN THE MATRIX TP = (1023 − 189) × 32 = 26688

FIG.12

| DI | 32 | |
|---|---|---|
| Rate | 0.5 | |
| | X | $\lambda_x$ | No. |
| | 2 | 0.179556355 | 2396 |
| | 3 | 0.147706835 | 1314 |
| | 6 | 0.177607914 | 790 |
| | 7 | 0 | 0 |
| | 8 | 0 | 0 |
| | 25 | 0.014051259 | 15 |
| | 26 | 0.440347722 | 452 |
| | 31 | 0.001161571 | 1 |
| | 32 | 0.039568345 | 33 |
| | X | $\rho_x$ | No. |
| | 10 | 0.3125 | 834 |
| | 11 | 0.6875 | 1668 |
| $\sigma_{GA}$ | 0.951482654 | |
| $SNR_{norm}(GA)$ | 0.2449 dB | |

|  | 1 | 2 | 3 | 4 | 5 | 6 | 7 | 8 | 9 | 10 | 11 | 12 | 13 |
|---|---|---|---|---|---|---|---|---|---|---|---|---|---|
| 1 |  |  |  |  |  |  |  |  |  |  |  |  |  |
| 2 |  |  |  |  |  |  |  |  |  |  |  |  |  |
| 3 |  |  |  |  |  |  |  |  |  |  |  |  |  |
| 4 |  |  |  |  |  |  |  |  |  |  |  |  |  |
| 5 |  |  |  |  |  |  |  |  |  |  |  |  |  |
| 6 |  |  |  |  |  |  |  |  |  |  |  |  |  |
| 7 |  |  |  |  |  |  |  |  |  |  |  |  |  |
| 8 |  |  |  |  |  |  |  |  |  |  |  |  |  |
| 9 |  |  |  |  |  |  |  |  |  |  |  |  |  |
| 10 |  |  |  |  |  |  |  |  |  |  |  |  |  |
| 11 |  |  |  |  |  |  |  |  |  |  |  |  |  |
| 12 |  |  |  |  |  |  |  |  |  |  |  |  |  |
| 13 |  |  |  |  |  |  |  |  |  |  |  |  |  |

1 variable node separete to
4 variable node

| | | | |
|---|---|---|---|
| DI | 32 | | |
| Rate | 0.5 | | |
| | X | $\lambda_x$ | No. |
| | 16 | 1 | 2046 |
| | X | $\rho_x$ | No. |
| | 32 | 1 | 1023 |

FIG.18

| DI | 32 | |
|---|---|---|
| Rate | 0.5 | |
| | X | $\lambda_x$ | No. |
| | 2 | 0.178580156 | 2923 |
| | 3 | 0.149376833 | 1630 |
| | 6 | 0.02016129 | 110 |
| | 7 | 0.219819159 | 1028 |
| | 8 | 0.005865103 | 24 |
| | 32 | 0.426197458 | 436 |
| | X | $\rho x$ | No. |
| | 10 | 0.3125 | 1023 |
| | 11 | 0.6875 | 2046 |

| | | |
|---|---|---|
| | 1 | 3 |
| | 2 | 4 |
| | 3 | 5 |
| | 4 | 6 |
| | 5 | 7 |
| | 6 | 8 |
| | 7 | 9 |
| | 8 | 10 |
| | 9 | 11 |
| | 10 | 12 |
| | 11 | 13 |
| | 12 | 14 |
| | 13 | 15 |
| | 14 | 1 |
| Col_s2(i,j)= | 15 | 2 |
| | 4 | 12 |
| | 5 | 13 |
| | 6 | 14 |
| | 7 | 15 |
| | 1 | 8 |
| | 2 | 9 |
| | 3 | 10 |
| | 4 | 11 |
| | 5 | 12 |
| | 6 | 13 |
| | 7 | 14 |
| | 8 | 15 |
| | 1 | 9 |
| | 2 | 10 |
| | 3 | 11 |

FIG.25

$$\text{Col\_s2\_4}(i,j)=\begin{array}{|c|c|c|c|}\hline 1 & 3 & 0 & 0 \\\hline 2 & 4 & 0 & 0 \\\hline 3 & 5 & 0 & 0 \\\hline 4 & 6 & 0 & 0 \\\hline 1 & 5 & 0 & 0 \\\hline 2 & 6 & 0 & 0 \\\hline 3 & 7 & 0 & 0 \\\hline 4 & 8 & 0 & 0 \\\hline 5 & 9 & 0 & 0 \\\hline 6 & 10 & 0 & 0 \\\hline 4 & 12 & 0 & 0 \\\hline 5 & 13 & 0 & 0 \\\hline 6 & 14 & 0 & 0 \\\hline 7 & 15 & 0 & 0 \\\hline 7 & 8 & 0 & 0 \\\hline 8 & 9 & 0 & 0 \\\hline 9 & 10 & 0 & 0 \\\hline 10 & 11 & 0 & 0 \\\hline 11 & 12 & 0 & 0 \\\hline 12 & 13 & 0 & 0 \\\hline 7 & 11 & 13 & 14 \\\hline 8 & 12 & 14 & 15 \\\hline 1 & 9 & 13 & 15 \\\hline 1 & 2 & 10 & 14 \\\hline 2 & 3 & 11 & 15 \\\hline\end{array}$$

FIG.26

| | | | | |
|---|---|---|---|---|
| Col_s2_4'(i,j)= | 1 | 3 | 0 | 0 |
| | 2 | 4 | 0 | 0 |
| | 3 | 5 | 0 | 0 |
| | 4 | 6 | 0 | 0 |
| | 5 | 7 | 0 | 0 |
| | 6 | 8 | 0 | 0 |
| | 7 | 9 | 0 | 0 |
| | 8 | 10 | 0 | 0 |
| | 9 | 11 | 0 | 0 |
| | 10 | 12 | 0 | 0 |
| | 4 | 12 | 0 | 0 |
| | 5 | 13 | 0 | 0 |
| | 6 | 14 | 0 | 0 |
| | 7 | 15 | 0 | 0 |
| | 1 | 8 | 0 | 0 |
| | 2 | 9 | 0 | 0 |
| | 3 | 10 | 0 | 0 |
| | 4 | 11 | 0 | 0 |
| | 5 | 12 | 0 | 0 |
| | 6 | 13 | 0 | 0 |
| | 7 | 11 | 13 | 14 |
| | 8 | 12 | 14 | 15 |
| | 1 | 9 | 13 | 15 |
| | 1 | 2 | 10 | 14 |
| | 2 | 3 | 11 | 15 |

LDPC CODE INSPECTION MATRIX GENERATION METHOD AND INSPECTION MATRIX GENERATION DEVICE

TECHNICAL FIELD

The present invention relates to a method of generating check matrixes for low density parity check (hereinafter "LDPC") codes that are used as error correction codes.

BACKGROUND ART

FIG. 27 is an illustration of an LDPC encoding/decoding system. This LDPC encoding/decoding system includes an encoder 101, a modulator 102, a channel 103, a demodulator 104, and a decoder 105. Prior to explaining a conventional method of generating check matrixes for LDPC codes, encoding and decoding using LDPC codes will be explained first.

At the sending side, the encoder 101 generates a check matrix H using a certain method, which will be described later, and generates a generator matrix G based on the following conditions:

G: k×n matrix (where k: information length, n: code-word length), $GH^T=0$ (T denotes transposition).

The encoder 101 then receives a message $(m_1 m_2 \ldots m_k)$ of an information length k, and generates a code-word C using the generator matrix G as follows:

$$C = (m_1 m_2 \ldots m_k)G$$
$$= (c_1 c_2 \ldots c_n) \text{ (where } H(c_1 c_2 \ldots c_n)^T = 0)$$

The modulator 102 subjects the generated code-word C to a digital modulation such as BPSK, QPSK or multi-valued QAM and transmits the resultant modulated signal.

At the receiving side, the demodulator 104 receives the modulated signal via the channel 103, and subjects it to a digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original $m_1 m_2 \ldots m_k$).

Conventionally, check matrixes for the LDPC codes are generated as explained below. The check matrix proposed by Gallager, the proposer of the LDPC, is shown in FIG. 28, as an example.

This matrix is a binary matrix of "1" and "0". Parts of "1" are hatched and parts of "0" are white. There are four "1"s in one row (hereinafter, "row weight"), and there are three "1"s in one column (hereinafter, "column weight"). All columns and rows have respective uniform weights. Thus, it is generally called "Regular-LDPC Code". In the Gallager's codes, as shown in FIG. 28, the matrix is divided into three blocks, for example, and the second and third blocks are subjected to random permutation.

Because the random permutation has no certain rule, it is required to execute a time-consuming search by computer to find codes with a better characteristic.

Euclid geometric codes are such LDPC codes that exhibit a relatively stable and nice characteristic and can definitely generate a matrix without the use of the computer search. Y. Kou et al. (Y. Kou, S. Lin, and M. P. C. Fossorier, "Low Density Parity Check Codes Based on Finite Geometries: A Rediscovery," ISIT 2000, pp. 200, Sorrento, Italy, Jun. 25 to 30, 2000. ) have proposed a method using such Euclid geometric codes. This method explains "Regular-LDPC Codes" consisting of regular ensembles.

A method of generating a check matrix for LDPC codes is herein proposed using Euclid geometric codes EG $(2, 2^6)$ or a kind of finite geometric codes. This method achieves a characteristic that is located closely but 1.45 decibels away from the Shannon limit at an error rate of $10^{-4}$. FIG. 29 is an illustration of the Euclid geometric codes EG $(2, 2^2)$, which has a structure of "Regular-LDPC Codes" with row and column weights of 4, 4.

Euclid geometric codes EG $(m, 2^s)$ have a characteristic defined as follows:

Code length: $n=2^{2s}-1$
Redundant bit length: $n-k=3^s-1$
Information length: $k=2^{2s}-3^s$
Minimum distance: $d_{min}=2^s+1$
Density: $r=2^s/(2^{2s}-1)$ As can be seen from FIG. 29, the Euclid geometric codes have a structure with a location of "1" in each row shifted periodically from that in an adjacent row. It is a characteristic of this structure that it can configure codes easily and definitely.

The method of generating check matrix proposed by Y. Kou et al. further includes changing row and column weights based on the Euclid geometric codes to extend rows and columns, if required. For example, when a column weight in EG $(2, 2^2)$ is separated into halves, in the method of Y. Kou et al., every other one of four weights located in one column is separated into two groups. FIG. 30 is an illustration of an exemplary regular separation of the column weight from 4 into 2.

Ludy et al. (M. G. Luby, M. Mitzenmacher, M. A. Shokrollahi, and D. A. Spielman, "Improved Low-Density Parity-Check Codes Using Irregular Graphs and Belief Propagation," Proceedings of 1998 IEEE International Symposium on Information Theory, pp. 171, Cambridge, Mass., Aug. 16 to 21, 1998. ) have reported that "Irregular-LDPC Codes" have a better characteristic than that of "Regular-LDPC Codes". The "Irregular-LDPC Codes" represent such LDPC codes that have non-uniformity in either or both of row and column weights.

Richardson et al. (T. J. Richardson and R. Urbanke, "The capacity of low-density parity-check codes under message-passing decoding," IEEE Trans. Inform. Theory, vol. 47, No. 2, pp. 599 to 618, February 2001. ) have analyzed it theoretically as well as Chung et al. (S.-Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001. )

In particular, Chung et al. have analyzed a "Sum-Product Algorithm" for LDPC codes, on the assumption that a Log Likelihood Ratio (hereinafter, "LLR") between an input and an output at an iterative decoder can be approximated in a Gaussian distribution, to derive a nice ensemble of row and column weights.

In the conventional method of generating check matrixes for LDPC codes by Chung et al., however, the number of "1" points in a row (corresponding to a degree distribution of variable nodes later described) and the number of "1" points in a column (corresponding to a degree distribution of check nodes later described) are both employed as variables to derive the degree distribution of variable nodes and the degree distribution of check nodes that can maximize the following equation (1) (rate: coding rate). In a word, a linear programming is employed to search an ensemble that minimizes a Signal to Noise Ratio (hereinafter, "SNR").

$$\text{rate} = 1 - \frac{\int_0^1 \rho(x)}{\int_0^1 \lambda(x)} \quad (1)$$

Therefore, a problem arises because a check matrix derived from the maximum of the "rate" has a flux and unstable characteristic. In addition, the conventional method of generating check matrixes for LDPC codes iteratively executes the derivation of the degree distribution of variable nodes and the derivation of the degree distribution of check nodes over certain times. Therefore, a problem arises that it takes a time to some extent for searching.

It is an object of the present invention to solve at least the problems in the conventional technology.

DISCLOSURE OF THE INVENTION

A method of generating check matrixes for irregular-LDPC codes, according to one aspect of the present invention includes, a weight determination step of determining a maximum value of a column weight; a basic matrix determination step of determining a basic matrix that fulfills conditions that "the weights of a row and a column are constant" and that "the number of cycle is equal to or more than six" based on the maximum value of a column; weight a coding rate determination step ot determining a coding rate; a weight searching step of searching an optimum ensemble of a row weight and a column weight according to a linear programming method in a state of a fixed coding rate, and so as to maximize a Gaussian noise; an information calculation step of calculating an information length based on a predetermined block length and the coding rate; a row deletion step of deleting a predetermined row based on the information length using the basic matrix; and a division step of dividing at random a row or a column of the matrixes after the row deletion in a predetermined order.

A method of generating check matrixes for irregular-LDPC codes using Euclid geometric codes, according to one aspect of the present invention includes, a weight determination step of determining a maximum value of a column weight; a Euclid geometric code determination step of determining Euclid geometric codes based on the maximum value of a column weight; a coding rate determination step of determining a coding rate; a weight searching step of searching an optimum ensemble of a row weight and a column weight according to a linear programming method in a state of a fixed coding rate, and so as to maximize a Gaussian noise; an information calculation step of calculating an information length based on a predetermined block length and the coding rate; a row deletion step of deleting a predetermined row based on the information length using the Euclid geometric codes; and a division step of dividing at random a row or a column of the matrixes after the row deletion in a predetermined order.

A method of generating check matrixes for irregular-LDPC codes, according to one aspect of the present invention includes, dividing the weight of a row or a column in the basic matrix that fulfills conditions that "the weights of a row and a column are constant" and that "the number of cycle is six or above" using a predetermined polynomial, and deleting a "cycle number 6" that becomes an element of characteristic degradation.

A method of generating check matrixes for irregular-LDPC codes using Euclid geometric codes, according to one aspect of the present invention includes, dividing the weight of a row or a column in the Euclid geometric codes using a predetermined polynomial, and deleting a "cycle number 6" that exists in the Euclid geometric codes and that becomes an element of characteristic degradation.

A check matrix generation apparatus for irregular-LDPC codes, according to one aspect of the present invention includes, a weight determination unit that determines a maximum value of a column weight; a basic matrix determination unit that determines a basic matrix that fulfills conditions that "the weights of a row and a column are constant" and that "the number of cycle is equal to or more than six" based on the maximum value of a column weight; a coding rate determination unit that determines a coding rate; a weight searching unit that searches an optimum ensemble of a row weight and a column weight according to a linear programming method in a state of a fixed coding rate, and so as to maximize a Gaussian noise; an information calculation unit that calculates an information length based on a predetermined block length and the coding rate; a row deletion unit that deletes a predetermined row based on the information length using the basic matrix; and a division unit that divides at random a row or a column of the matrixes after the row deletion in a predetermined order.

A check matrix generation apparatus for irregular-LDPC codes using Euclid geometric codes, according to one aspect of the present invention includes, a weight determination unit that determines a maximum value of a column weight; a Euclid geometric code determination unit that determines Euclid geometric codes based on the maximum value of a column weight; a coding rate determination unit that determines a coding rate; a weight searching unit that searches an optimum ensemble of a row weight and a column weight according to a linear programming method in a state of a fixed coding rate, and so as to maximize a Gaussian noise; an information calculation unit that calculates an information length based on a predetermined block length and the coding rate; a row deletion unit that deletes a predetermined row based on the information length using the Euclid geometric codes; and a division unit that divides at random a row or a column of the matrixes after the row deletion in a predetermined order.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 2 is an illustration of an ensemble of a generator function $\lambda(x)$ and a generator function $\rho(x)$ when the rate is 0.5; FIG. 3 is an illustration of Euclid geometric codes EG (2, $2^2$); FIG. 4 is an illustration of a column number of "1" in each row in the Euclid geometric codes EG (2, $2^2$) shown in FIG. 3; FIG. 5 is an illustration of a column number of "1" in each row after a rearrangement; FIG. 6 is an illustration of a column number of "1" in each row after deleting five rows from the bottom in FIG. 5; FIG. 7 is an illustration of a weight distribution within a column after deleting rows; FIG. 8 is an illustration of a weight distribution after deleting five rows in the Euclid geometric codes EG (2, $2^5$); FIG. 9 is an illustration of a weight distribution after deleting 189 rows in the Euclid geometric codes EG (2, $2^5$); FIG. 10 is an exemplary diagram of a division table; FIG. 11 is an illustration of a weight distribution adjusting table; FIG. 12 is an illustration of an ensemble of a generator function $\lambda(x)$ and a generator function $\rho(x)$ after a weight distribution; FIG. 18 is an illustration of an ensemble of "Irregular-LDPC Codes"; FIG. 19 is an illustration of a permutation pattern $LB_j$ (i) of a basic random sequence C(i) and, a basic random sequence; FIG. 20 is an illustration of Latin square sequences $L_{jq}$ (i); FIG. 24 is an illustration of a matrix when the weight of the column is 2 by separating the matrix shown in FIG. 23 according to the expression (19); FIG. 25 is an illustration of a matrix col_s2_4 (i, j) when the weight of the matrix col (i, j) is simply separated into former two columns and latter two columns; FIG. 26 is an illustration of a matrix col_s2_4' (i, j) when the column is separated based on a method according to the second embodiment; FIG. 29 is an illustration of a configuration of Euclid geometric codes EG (2, $2^2$); and FIG. 30 is an illustration of an exemplary column weight regularly separated from 4 into 2.

BEST MODE FOR CARRYING OUT THE INVENTION

Exemplary embodiments of methods of generating check matrixes for LDPC codes and a check matrixes generation apparatus according to the present invention will be explained in detail below based on the drawings. It should be noted that the embodiments are not intended to limit the invention.

Figure 1:
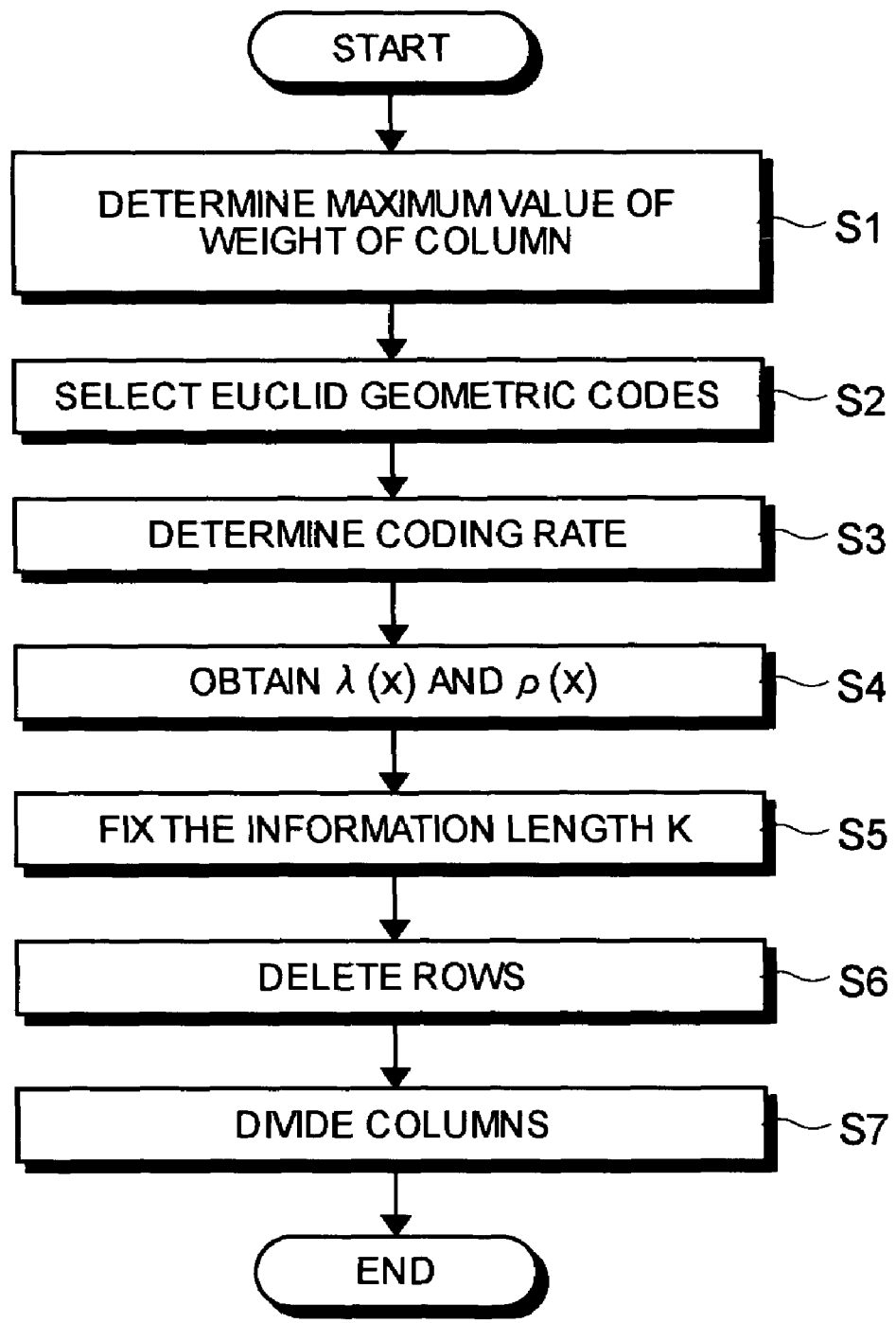
FIG. 1 is a flowchart of a method of generating check matrixes for LDPC codes according a first embodiment of the present invention.

FIG. 1 is a flowchart of a method of generating check matrixes for LDPC codes according to a first embodiment of the present invention. The method of generating check matrixes for LDPC codes according to the present embodiment may be executed on a communication apparatus according to set parameters, or may be executed on other control unit (such as a computer) outside of the communication apparatus. When the method of generating check matrixes for LDPC codes is generated on the control unit, check matrixes generated for LDPC codes are stored in the communication apparatus. It is assumed here that the method is executed on the communication apparatus.

Figure 27:
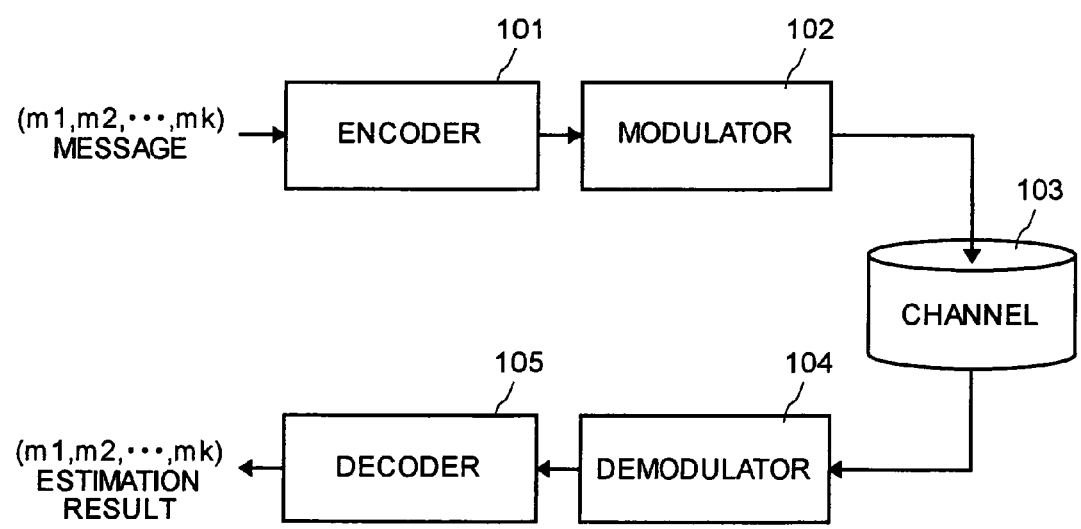
FIG. 27 is an illustration of an LDPC encoding/decoding system.
Figure 28:
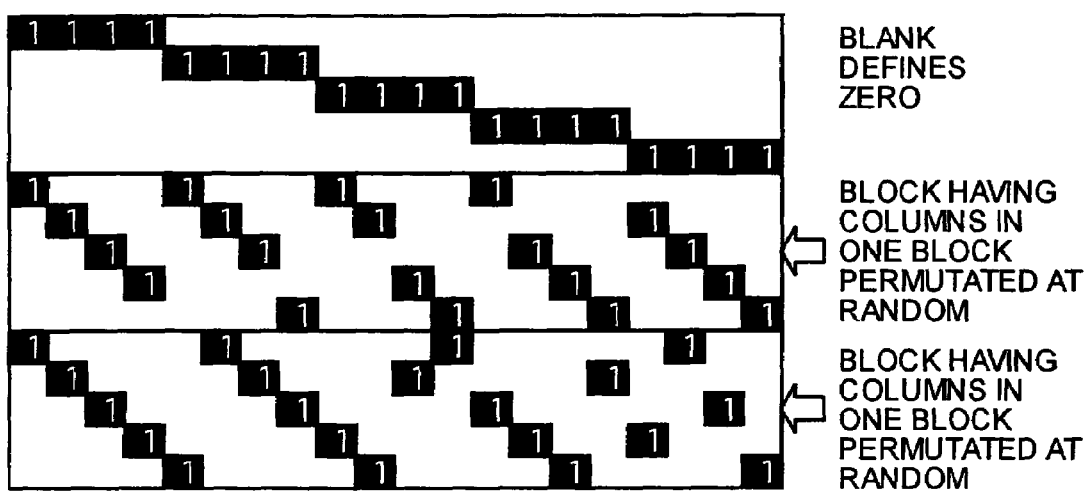
FIG. 28 is an illustration of a conventional check matrix for LDPC codes.

Prior to explanation of the method of generating check matrixes for LDPC codes according to the present embodiment, the positions of an encoder and a decoder capable of achieving the method is explained first together with the conventional method of generating check matrixes for "Irregular-LDPC Codes". The LDPC encoding/decoding system has the same configuration as that previously explained in FIG. 27.

At the sending side, the encoder 101 generates a check matrix H using the method of generating check matrixes for LDPC codes according to the present embodiment and generates a generator matrix G based on the following conditions:

G: k×n matrix (k: information length, n: code-word length)

$GHT^T=0$ (T denotes transposition)

The encoder 101 then receives a message ($m_1 m_2 \ldots m_k$) of an information length k, and generates a code-word C using the generator matrix G.

$$C = (m_1 m_2 \ldots m_k)G$$
$$= (c_1 c_2 \ldots c_n) \text{(where } H(c_1 c_2 \ldots c_n)^T = 0)$$

The modulator 102 subjects the generated code-word C to digital modulation such as BPSK, QPSK or multi-valued QAM and transmits the resultant modulated signal.

At the receiving side, the demodulator 104 receives the modulated signal via the channel 103, and subjects it to digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original ($m_1 m_2 \ldots m_k$)).

Chung et al. (S.-Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001.) have theoretically analyzed the conventional method of generating check matrixes for "Irregular-LDPC Codes". The method is explained next in detail. In this method, a "Sum-Product Algorithm" for LDPC codes is analyzed, on the assumption that a Log Likelihood Ratio (LLR) between an input and an output at an iterative decoder can be approximated in a Gaussian distribution, to derive a nice ensemble of row and column weights.

The method of generating check matrixes for LDPC codes described in Chung et al., or Gaussian Approximation, has a premise that defines a point of "1" on a row as a variable node and a point of "1" on a column as a check node in the check matrix.

LLR message propagation from a check node to a variable node is analyzed first. The following equation (2) is defined on condition that $0<s<\infty$ and $0 \leq t < \infty$. Here, $s=m_{u0}$ denotes a mean of u0; u0 a Log Likelihood Ratio (LLR) associated with a signal received via a channel containing a Gaussian noise of distributed value $\sigma_n^2$; and t an ensemble average of LLR output values at check nodes at the time of certain iteration.

$$f_j(s, t) = \phi^{-1}\left(1 - \left[1 - \sum_{i=2}^{d_l} \lambda_i \phi(s + (i-1)t)\right]^{j-1}\right) \quad (2)$$

$$f(s, t) = \sum_{j=2}^{d_r} \rho_j f_j(s, t)$$

$\lambda(x)$ and $\rho(x)$ respectively denote generator functions of degree distribution associated with variable nodes and check nodes, and can be represented by the equations (3) and (4). (A degree is expressed as the number of "1"s in each row of variable nodes or each column of check nodes). In addition, $\lambda_i$ and $\rho_i$ respectively denote ratios of edges belonging to variable nodes and check nodes at a degree of i. Finally, $d_l$ denotes a degree of maximum variable nodes, and $d_r$ a degree of maximum check nodes.

$$\lambda(x) = \sum_{i=2}^{d_l} \lambda_i x^{i-1} \quad (3)$$

$$\rho(x) = \sum_{i=2}^{d_r} \rho_i x^{i-1} \quad (4)$$

$\phi(x)$ is defined as the following equation (5):

$$\phi(x) = \begin{cases} 1 - \frac{1}{\sqrt{4\pi x}} \int_R \tanh\frac{u}{2} \cdot e^{-\frac{(u-x)^2}{4x}} du & \text{if } x > 0 \\ 1 & \text{if } x \leq 0 \end{cases} \quad (5)$$

The equation (2) can be represented equivalently by the following equation (6):

$$t_I = f(s, t_{I-1}) \quad (6)$$

where $t_I$ denotes an ensemble average of LLR output values on check nodes at the time of the I-th iteration.

A condition required for deriving an SNR limit (threshold) that provides an error with a value of 0 includes $t_I(s) \to \infty$ (expressed as $R^+$) when $I \to \infty$. In order to satisfy this condition, it is required to satisfy the following conditional expression (7):

$$t < f(s, t), \text{ all } t \in R^+ \quad (7)$$

LLR message propagation from a variable node to a check node is analyzed next. The following equation (8) is defined on condition that $0 < s < \infty$ and $0 < r \leq 1$. In this case, r has an initial value $r_0$ of $\phi(s)$.

$$h_i(s, r) = \phi\left(s + (i-1)\sum_{j=2}^{d_r} \rho_j \phi(1 - (1-r)^{j-1})\right) \quad (8)$$

$$h(s, r) = \sum_{i=2}^{d_l} \lambda_i h_i(s, r)$$

The equation (8) can be represented equivalently by the following equation (9):

$$r_I = h(s, r_{I-1}) \quad (9)$$

A condition required for deriving an SNR limit (threshold) that provides an error with a value of 0 includes $r_I(s) \to 0$. In order to satisfy this condition, it is required to satisfy the following conditional expression (10):

$$r > h(s, r), \text{ all } r \in (0, \phi(s)) \quad (10)$$

In the paper by Chung et al., optimal degrees are searched for variable nodes and check nodes using the above equation in the following procedure (i.e., Gaussian Approximation):

(1) On the assumption that a generator function $\lambda(x)$ and a Gaussian noise $\sigma_n$ are given, a generator function $\rho(x)$ is used as a variable to search a point that maximizes the equation (1). A constraint condition associated with this search includes normalization to $\rho(x)=1$ and satisfaction of the equation (7).

(2) On the assumption that a generator function $\rho(x)$ and Gaussian noise $\sigma_n$ are given (as a value resulted from the procedure (1), for example), a generator function $\lambda(x)$ is used as a variable to search a point that maximizes the equation (1). A constraint condition associated with this search includes normalization to $\lambda(x)=1$ and satisfaction of the equation (10).

(3) In order to find the maximum "rate", the steps (1) and (2) are iteratively executed to search a better ensemble of the generator function $\lambda(x)$ and the generator function $\rho(x)$ with a linear programming.

(4) Finally, signal power is normalized to 1 based on Gaussian noise $\sigma_n$ to find an SNR limit (threshold).

$$\text{threshold (dB)} = -10 \ast \log 10(2 \ast \sigma_n^2) \quad (11)$$

A problem is found in the method of Chung et al. because a check matrix derived from the maximum of the "rate (coding rate)" is flux. Such the check matrix is not suitable for practical design because the rate fixed in design as a spec varies. In addition, the Gaussian Approximation iteratively executes the derivation of the degree distribution associated with variable nodes and the derivation of the degree distribution associated with check nodes over certain times. Therefore, a problem arises that it takes time to some extent for searching. Further, a problem arises that the check matrix does not easily apply to an optional ensemble, an optional code length, and an optional coding rate.

The present invention provides a method of a definite and characteristic-stabilized check matrix for "Irregular-LDPC Codes", which corresponds to an optional ensemble, an optional code length, and an optional coding rate, is searched easily in a short time (refer to FIG. 1). Specifically, the check matrix for "Irregular-LDPC Codes" is generated by dividing or deleting the arrangement of "1" in one row or one column in the Euclid geometric codes. FIG. 1 is an illustration of the method of generating check matrixes for LDPC codes of the first embodiment.

In the method of generating a check matrix for LDPC codes according to the present embodiment, a maximum value dI of the column weight is first determined (step S1, FIG. 1). As an example, dI is set equal to 32.

Euclid geometric codes EG $(2, 2^s)$ as the base are selected based on the column weight dI (step S2). For example, when dI=32, the column weight $2^s$ of the Euclid geometric codes EG $(2, 2^s)$ becomes s=5. Therefore, Euclid geometric codes EG $(2, 2^5)$ are selected. In general, s that fulfills the condition of $2^{s-1} < dI < 2^{s+1}$ is selected.

A coding rate (rate) is determined (step S3). A case when the rate is 0.5 will be explained, for example.

The ensemble of the generator function $\lambda(x)$ of the degree distribution of the variable node and the generator function $\rho(x)$ of the degree distribution of the check node is obtained with the later-described Gaussian Approximation (step S4). FIG. 2 is an illustration of an ensemble of the generator function $\lambda(x)$ and the generator function $\rho(x)$ with the rate=0.5, where x denotes a weight, and $\lambda_x$ and $\rho_x$ denote the weight distributions of the variable node and the check node respectively.

Steps of executing the Gaussian Approximation to search the ensemble of the generator function $\lambda(x)$ of the degree distribution of the variable node and the generator function $\rho(x)$ of the degree distribution of the check node will be explained.

(1) It is assumed that the "rate" is given. That is, a requisite "rate" is fixed because a target "rate" is often designated previously in practical design.

(2) A generator function $\lambda(x)$ and a generator function $\rho(x)$ are simultaneously used as variables, and a linear programming is employed to search optimal generator functions $\lambda(x)$ and $\rho(x)$ that can maximize Gaussian noise $\sigma_n$. A constraint condition associated with this search includes normalization to $\lambda(1)=1$, $\rho(1)=1$ and satisfaction of the equation (10).

Thus, the present embodiment employs the linear programming once to find such generator functions $\lambda(x)$ and $\rho(x)$ that satisfy the equations (9) and (10). Therefore, it is possible to search a definite and characteristic-stabilized check matrix for LDPC codes more easily in a shorter time than the method described in the paper that iteratively executes derivation of the generator functions $\lambda(x)$ and $\rho(x)$ to derive both optimal values.

The ensemble is obtained at step S4. The block length N is obtained, and the information length K is fixed from the block length N (step S5). K is obtained as follows when N=5000.

$$K=N\times rate=5000\times 0.5=2500$$

Next, rows corresponding to the information length K are deleted (step S6). Row deletion methods (a first deletion method, and a second deletion method) according to the present embodiment will be explained in detail. The number of rows and the number of columns of the Euclid geometric codes EG $(2, 2^s)$ that become the base can be expressed as $2^5\times 2^5-1$.

According to the first deletion method, one row of a weight 32 is divided into one row of a weight 10 and two rows of a weight 11 based on the ensemble shown in FIG. 2. In this example, the ratio of a weight 10 becomes $\rho_{10}=10/32=0.3125$, and the ratio of a weight 6 becomes $\rho_{10}=22/32=0.6875$. The number of rows $R_{EG}$ of the Euclid geometric codes EG $(2, 2^s)$ is $R_{EG}=2^5\times 2^5-1=1023$. Accordingly, the number of rows of the weight 10 becomes 1023, and the number of rows of the weight 11 becomes 2046. As a result, the total row number $R_T$ becomes $R_T=1023+2046=3069$. Therefore, the number of deleting rows $D_r$ becomes as follows by utilizing the fact that the number of rows in the check matrixes coincides with the information length K.

$$D_r=R_T-K$$

To divide each row of the weight 32 into one row of the weight 10 and two rows of the weight 11, a random division, that is, a "division method using the Latin square of basic random sequences" described later is executed, for example.

As explained above, according to the first deletion method, in order to divide one row of the weight 32 into one row of the weight 10 and two rows of the weight 11, $D_r=R_T-K=3069-2500=569$ rows are deleted from the matrixes after the division. 569 rows are deleted without changing the ratio $\rho_{10}$, and $\rho_{11}$ as far as possible.

According to the second deletion method on the other hand, the rows are deleted at the stage of the basic Euclid geometric codes EG $(2, 2^s)$. The number of rows to be deleted $D_{r\_EG}$ is obtained from the basic Euclid geometric codes EG $(2, 2^s)$ as follows:

$$D_{r\_EG}=R_{EG}\times(R_T-K)/R_T$$

When $D_{r\_EG}=1023\times 569/3069=189.6667$, for example, 189 rows are deleted from the Euclid geometric codes EG $(2, 2^5)$.

In this case, when rows are divided at random after the deletion, the number of rows also becomes $(1023-569)\times 3=2502$, which becomes close to the target code length 2500.

Actually, after 189 rows are deleted from the Euclid geometric codes EG $(2, 2^5)$, a random division is carried out for $1023-189=834$ rows, thereby to obtain $834\times 3=2502$ rows (each row is divided into one row of the weight 10 and two rows of the weight 11), with the remainder of two rows abandoned.

Figure 3:
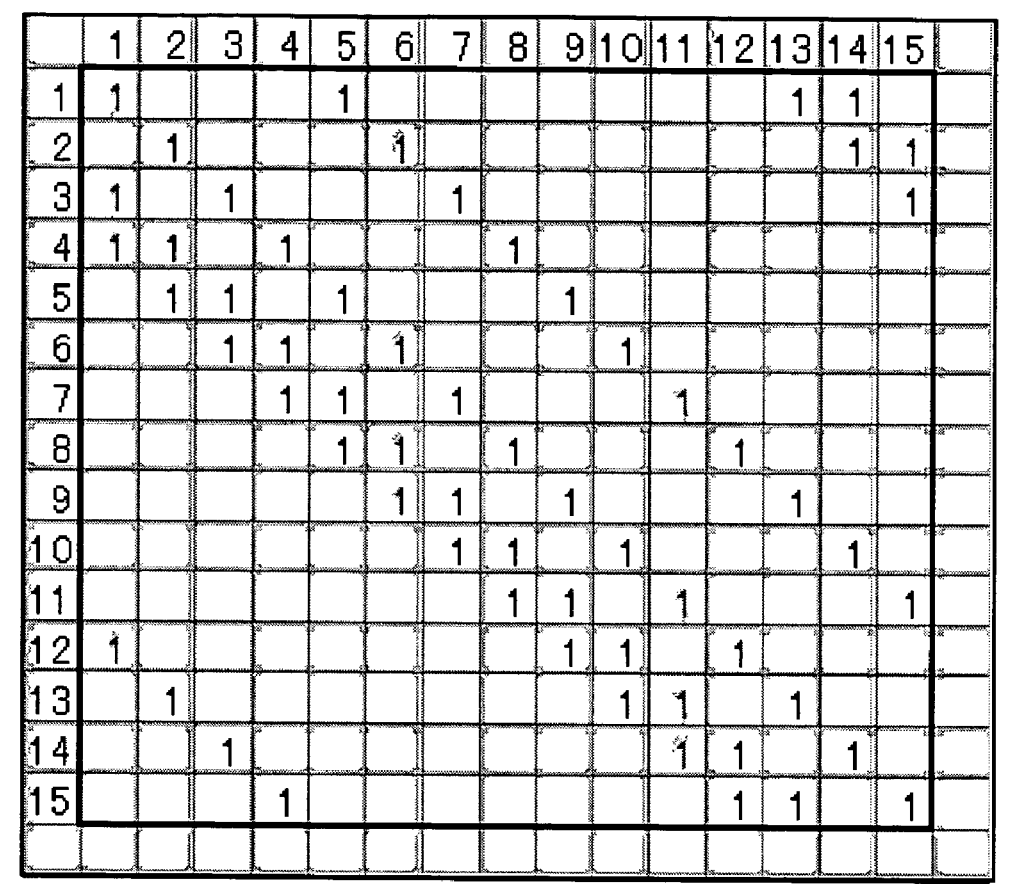

The second deletion method will be explained in detail with reference to the drawings. For the sake of convenience of explanation, the Euclid geometric codes EG $(2, 2^2)$ are used. FIG. 3 is an illustration of Euclid geometric codes EG $(2, 2^2)$ (where a blank box represents zero). FIG. 4 is an illustration of a column number of "1"s in each row in the Euclid geometric codes EG $(2, 2^2)$ shown in FIG. 3. The row number of each row "1" is expressed as Row (i, j) (where i denotes a row number, and j denotes a column number). For example, the first row of the Euclid geometric codes EG $(2, 2^2)$ is expressed as Row $(1, j)=\{1, 5, 13, 14\}$.

The order of the rows is rearranged to set the first column of the Row (i, j) in an ascending order based on FIG. 4. FIG. 5 is an illustration of a column number of "1"s in each row after the rearrangement. The column number of "1" of each row after the rearrangement is expressed as Row' (i, j).

When five rows are to be deleted, for example, five rows from the bottom of Row' (i, j) are deleted. FIG. 6 is an illustration of a column number of "1"s in each row after deleting five rows from the bottom in FIG. 5. The column number of "1"s of each row after the deletion is expressed as Row_5' (i, j). FIG. 7 is an illustration of a weight distribution within the column after deleting rows, expressing a relationship between the column number and the number of "1"s included in this column in FIG. 6. FIG. 8 is an illustration of a weight distribution after deleting five rows in the Euclid geometric codes EG $(2, 2^5)$.

FIG. 9 is an illustration of a weight distribution after deleting 189 rows in the Euclid geometric codes EG $(2, 2^5)$ in a process similar to that of the second deletion method.

At step S6, the rows are deleted. Finally, the columns are divided (at step S7). The division method according to the present embodiment will be explained in detail with reference to FIG. 2 for the sake of the convenience. The value of x of the weight distribution $\lambda_x$ and the value of x of the weight distribution $\rho_x$, that is, the weight of the column and the row, can structure 32, based on the combination of x respectively. FIG. 10 is an illustration of a division table. For example, a combination of 7×4 and 2×2 indicates that one column of the weight 32 can be divided into four columns of the weight 7 and two columns of the weight 2. When the weight of each row and each column that become the basis can suitably divide the Euclid geometric codes EG $(2, 2^5)$ as shown in FIG. 10, the check matrixes for "Irregular-LDPC Codes" can be configured. Although not shown in FIG. 10, rows can be divided in a similar manner for the column weights 31, 30, 29, 28, 27, 26, 25, 24, 23, 22, and 21 (refer to FIG. 9).

Prior to the dividing process, the weight distributions in the ensemble of generator functions $\lambda(x)$ and $\rho(x)$ shown in FIG. 2 are subjected to adjustment in the following procedures. FIG. 11 is an illustration of a table for adjusting a weight distribution.

(1) The ensemble of the generator functions $\lambda(x)$ and $\rho(x)$ (see FIG. 2) found through Gaussian Approximation is set in the table on the second column and the third column.

(2) The weight distributions $\lambda_x$ and $\rho_x$ (the third column) are multiplied by the total number of "1"s, TP=26688, in the entire Euclid geometric codes EG $(2, 2^5)$ to find the total weight number of weight units, and the total weight number of weight units and a sum thereof are set on the fourth column.

(3) The total weight number of weight units (on the fourth column) is divided by the corresponding weight of x to find the total column number of weight units, which is set on the fifth column.

(4) If the total column number of weight units contains a fraction after the decimal point, a rounding process (such as rounding off, rounding up, and rounding down) is performed, and the rounded result is set on the sixth column.

(5) The rounded total column number of weight units (on the sixth column) is multiplied by the corresponding weight of x to find the total column number of weight units after the rounding process, which is set on the seventh column. It is then determined whether each sum of the total column numbers (a total row on the seventh column) is equal to the total number of "1"s in the matrix (TP=26688).

(6) If it is not equal to the total number of "1"s in the matrix, the rounded total column number of weight units (on the seventh column) is adjusted on an integer basis, and the adjusted result is set on the eighth column. In this case, the sum on the eighth column is adjusted to have a value equal to the total number of "1"s in the matrix (TP=26688).

(7) The adjusted total weight number of weight units (on the eighth column) is divided by the corresponding weight of x to find the adjusted total column number of weight units, which is set on the ninth column. Each adjusted weight distribution (on the eleventh column) is determined to have a value as close to the value found through Gaussian Approximation (on the third column) as possible.

FIG. 12 is an illustration of an ensemble of a generator function $\lambda(x)$ and a generator function $\rho(x)$ after the weight distribution. In this figure, $\sigma_{GA}$ denotes a noise variance at the time of the "threshold" obtained by the Gaussian Approximation, and $SNR_{norm}$ (GA) denotes a difference between SNR at the time of the "threshold" obtained by the Gaussian Approximation and SNR of Shannon limit.

Figures 13, 14:
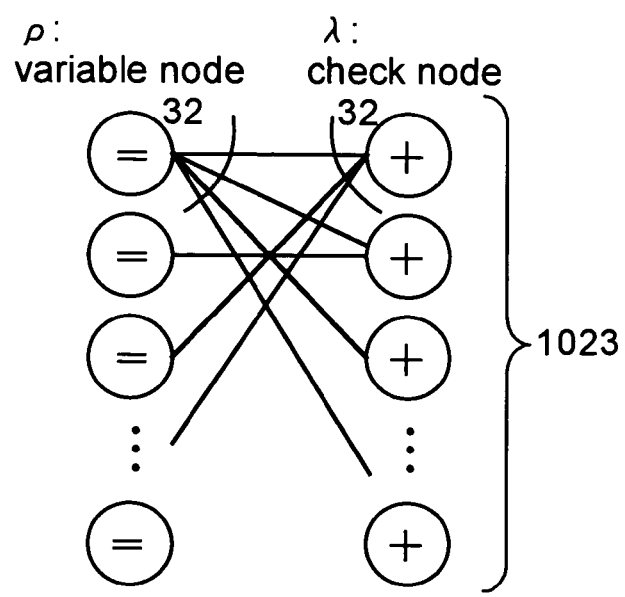
FIG. 13 is an illustration of a conventional dividing procedure.
FIG. 14 is an illustration of a graph of EG (2, $2^5$) before division.

A procedure of dividing one row or one column in Euclid geometric codes is explained next. Y. Kou et al. have proposed a regular dividing method with respect to the dividing procedure. FIG. 13 is an illustration of the dividing procedure proposed in the paper. As shown in FIG. 13, a matrix is numbered with column numbers 1, 2, 3 . . . in sequence from the left end and row numbers 1, 2, 3 . . . in sequence from the top. For example, 32 points×1 row can be divided into 8 points×4 rows regularly in accordance with the following equation (12):

$$S_m(n)=B_I(m+4*n) \qquad (12)$$

where m=1, 2, 3, 4; n=0, 1, 2, 3, 4, 5, 6, 7; and I denotes a column number in EG (2, $2^5$). $B_I(x)$ denotes a position of "1" on the I-th column in EG (2, $2^5$), and $S_m(n)$ a position of "1" on the m-th column in the divided matrix.

Specifically, a row number indicative of a position of "1" on a row in EG (2, $2^5$) is represented by:

$B_1$ (x)={1 32 114 136 149 223 260 382 402 438 467 507 574 579 588 622 634 637 638 676 717 728 790 851 861 879 947 954 971 977 979 998}

As a result, extracting a number indicative of "1" from $B_I(x)$ regularly, row numbers indicative of positions of "1" on the 1st to 4th columns in the divided matrix are represented by:

$S_1$ (n)={1 149 402 574 634 717 861 971}
$S_2$ (n)={32 223 438 579 637 728 879 977}
$S_3$ (n)={114 260 467 588 638 790 947 979}
$S_4$ (n)={136 382 507 622 676 851 954 998}

Thus, 32 points×1 row can be divided into 8 points×4 rows.

On the other hand, in the dividing procedure according to the present embodiment, Euclid geometric codes are not divided regularly as described above. Rather, a number indicative of "1" is extracted from $B_I(x)$ at random. Any extracting process may be applied so long as it can retain randomness.

Accordingly, on the m-th column in the divided matrix, an exemplary position of "1", $R_m(n)$, is represented by:

$R_1$ (n)={1 114 574 637 851 879 977 979}
$R_2$ (n)={32136 402 467 588 728 861 971}
$R_3$ (n)={149 260 382 438 579 638 717 998}
$R_4$ (n)={223 507 622 634 676 790 947 954}

Figure 15:
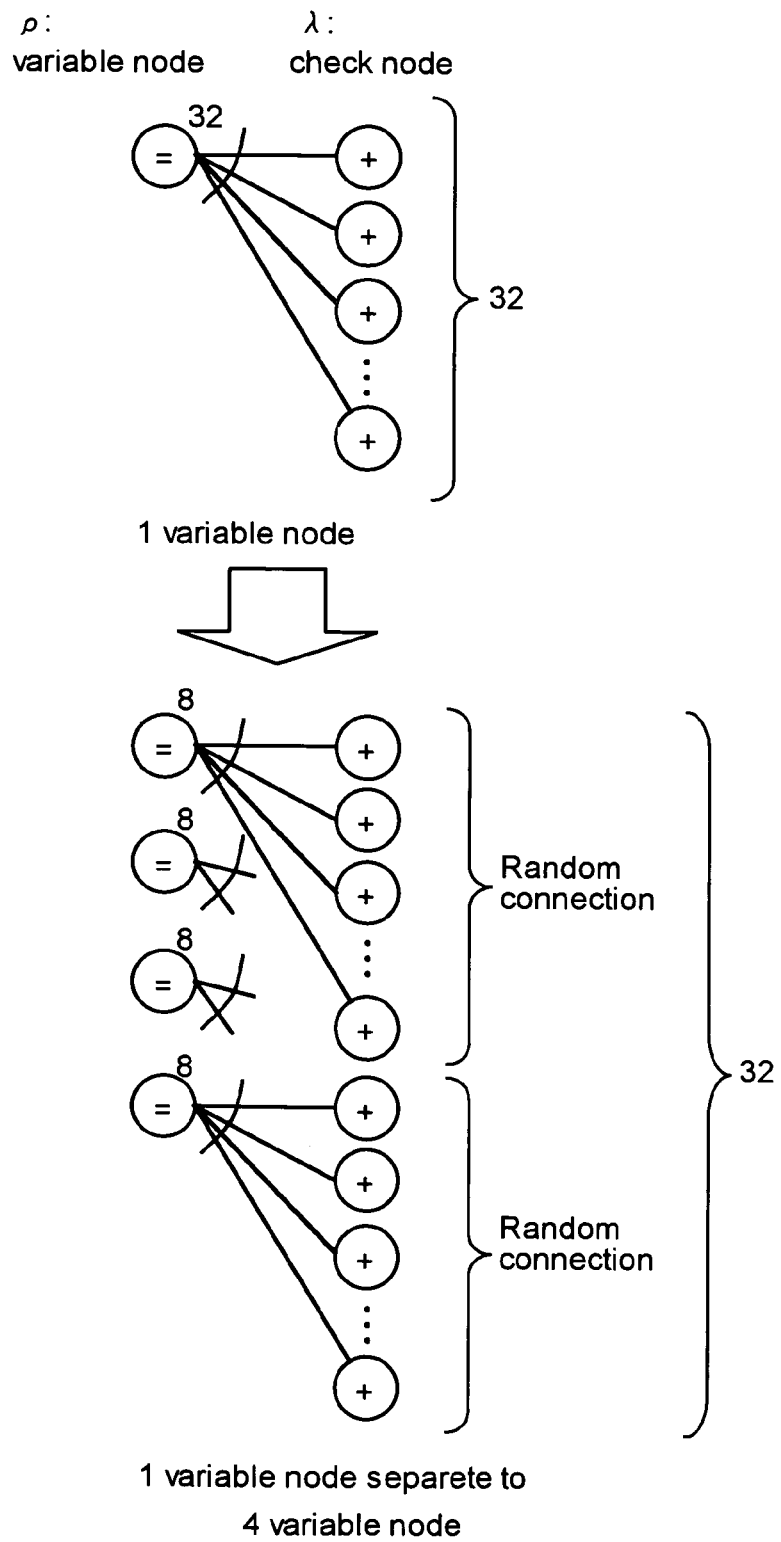
FIG. 15 is an illustration of a graph of EG (2, $2^5$) after division of a random selection of an edge.

The dividing procedure of the present embodiment can be expressed on a graph as follows. FIG. 14 is an illustration of a graph of EG (2, $2^5$) before division. A line connecting both nodes is expressed as an edge. FIG. 14 shows Euclid geometric codes in 1023 rows×1023 columns (with each row/column weight of 32) before division. FIG. 15 is an illustration of a graph after the division, which selects edges from EG (2,$2^5$) at random.

Figures 16, 17:
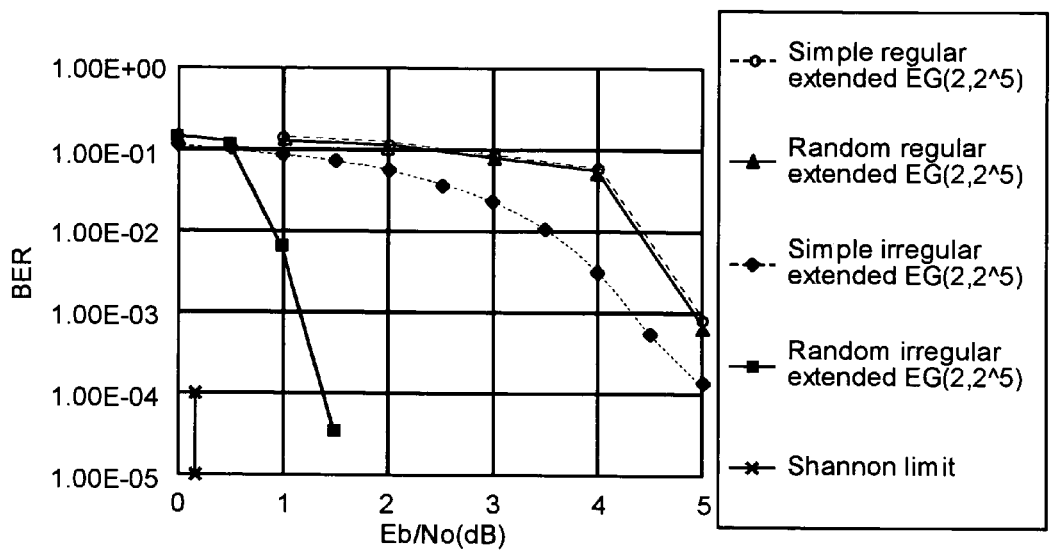
FIG. 16 is an illustration of a relation between an Eb/No and a bit error rate.
FIG. 17 is an illustration of an ensemble of "Regular-LDPC Codes"

Characteristics of the LDPC codes previously described are compared below. FIG. 16 is an illustration of a relation between an Eb/No (Signal power to Noise power per information bit) to a bit error rate (hereinafter, "BER"). The number of iteration is equal to 50 times. The decoding method is a "Sum-Product Algorithm".

In FIG. 16, "Simple regular extended EG $(2,2^5)$" correspond to "Regular-LDPC Codes" with rate=0.5 when a regular column division in EG $(2,2^5)$ proposed by Y. Kou et al. is performed (refer to the conventional technique). "Random regular extended EG $(2,2^5)$" correspond to "Regular-LDPC Codes" with rate=0.5 when a random column division in EG $(2,2^5)$ according to the present embodiment is performed. FIG. 17 is an illustration of an ensemble of these "Regular-LDPC Codes".

In FIG. 16, "Simple irregular extended EG $(2,2^5)$" correspond to "Irregular-LDPC Codes" with rate=0.5 when a regular column division in EG $(2,2^5)$ proposed by Y. Kou et al. is performed to the ensemble specified in the method in FIG. 18. "Random irregular extended EG $(2,2^5)$" correspond to "Irregular-LDPC Codes" with rate=0.5 when a random column division in EG $(2,2^5)$ according to the present embodiment is performed to the ensemble specified in the method in FIG. 18. FIG. 18 is the diagram of the ensemble of these "Irregular-LDPC Codes".

As can be seen from FIG. 16, "Irregular-LDPC Codes" have a better performance than that of "Regular-LDPC Codes" at the same rate. The regular division proposed in the paper of Y. Kou et al. can not allow a larger improvement even with "Irregular-LDPC Codes". In contrast, the random division of the present embodiment can provide a remarkably improved performance when it is implemented.

As explained above, in the present embodiment, the maximum value dl of the column weight is first determined. Next, the Euclid geometric codes EG (2, $2^s$) as the base are selected based on the column weight dl. The coding rate (rate) is determined next. Next, the ensemble of the generator function $\lambda(x)$ of the degree distribution of the variable node and the generator function $\rho(x)$ of the degree distribution of the check node is obtained using the Gaussian Approximation. Next, the information length K is firmed from the predetermined block length N, and the deletion processing corresponding to the information length K is carried out in the predetermined order. Finally, the column division processing is carried out in the predetermined order. With this arrangement, a definite and characteristic-stabilized check matrix for "Irregular-LDPC Codes" can be generated easily in a short time corresponding to an optional ensemble, an optional code length, and an optional coding rate.

An example of the random division is detailed next. In other words, the "division method using the Latin square of basic random sequences" will be explained in detail. A random sequence is generated easily and definitely for the random division. This method has an advantage that the sending side and the receiving side can generate the same random sequence. This is extremely important in a practical system. There is another advantage that a condition associated with code characteristics can be defined correctly.

(1) Creation of basic random sequences:

An example of random sequence creation is described below using Euclid geometric codes EG $(2,2^5)$ for convenience of explanation. In Euclid geometric codes EG $(2,2^5)$, the number of "1"s present in a row is equal to $2^5=32$.

When P is used for the minimum prime number that satisfies $P \geq 2^s$, for example, P=37 in the case of $2^5$. A basic random sequence C(i) with a sequence length, P−5=32, is created in accordance with the equation (13):

$$C(1)=1$$

$$C(i+1)=G_0 \times C(i) \bmod P \quad (13)$$

where i=0, 1, . . . , P−2; and $G_0$ denotes an original source of Galois Field GF(P). As a result, C(i) is represented by:

C (i)={1 2 4 8 16 32 27 17 34 31 25 13 26 15 30 23 9 18 36 35 33 29 21 5 10 20 3 6 12 24 11 22 7 14 28 19}

(2) Numbers larger than 32 are deleted so as to obtain the sequence length $2^5=32$.

C (i)={1 2 4 8 16 32 27 17 31 25 13 26 15 30 23 9 18 29 21 5 10 20 3 6 12 24 11 22 7 14 28 19}

(3) A skip interval S (j) is defined as in equation (14) to read the basic random sequence at a constant interval:

$$S(j)=j \text{ where } j=1, 2, \ldots, 2^s \quad (14)$$

(4) A transposition pattern LBj (i) is prepared using the following equation (15):

j=1, 2, . . . , $2^s$ i=1, 2, . . . P−1  (15)

Figure 19:
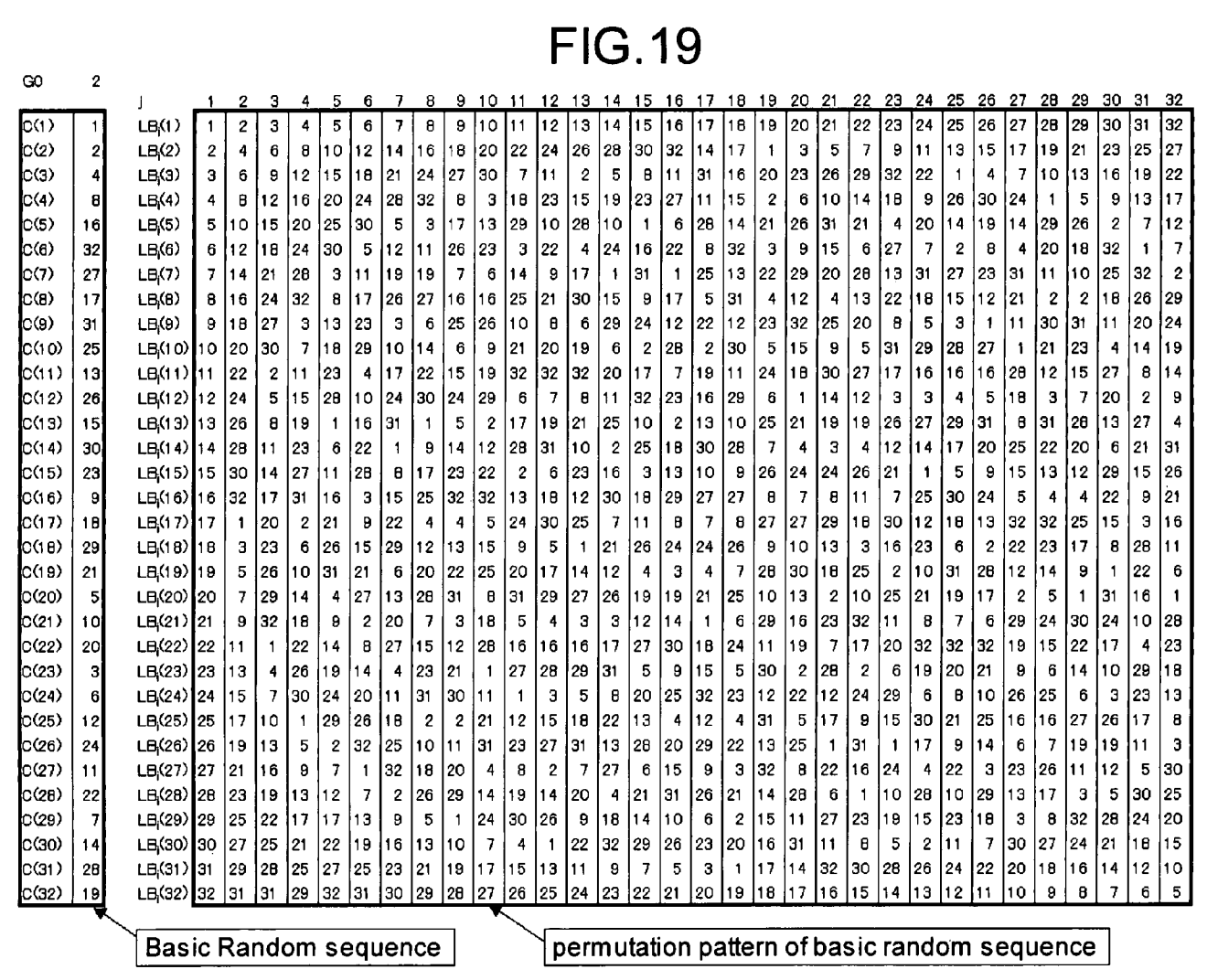

For LBj (i), numbers larger than $2^s$ are deleted. FIG. 19 is an illustration of a permutation pattern LBj (i) of the basic random sequence C(i) and a basic random sequence.

(5) A j-th Latin square sequences $L_{jp}$ (i) in the column q and the row i is calculated from the following equation (16):

$$L_{jp}(i)=LB_j(((q+i-2) \bmod 2^s)+1)$$

j=1, 2, . . . , $2^s$ i=1, 2, . . . , $2^s$ q=1, 2, . . . , $2^s$  (16)

Figure 20:
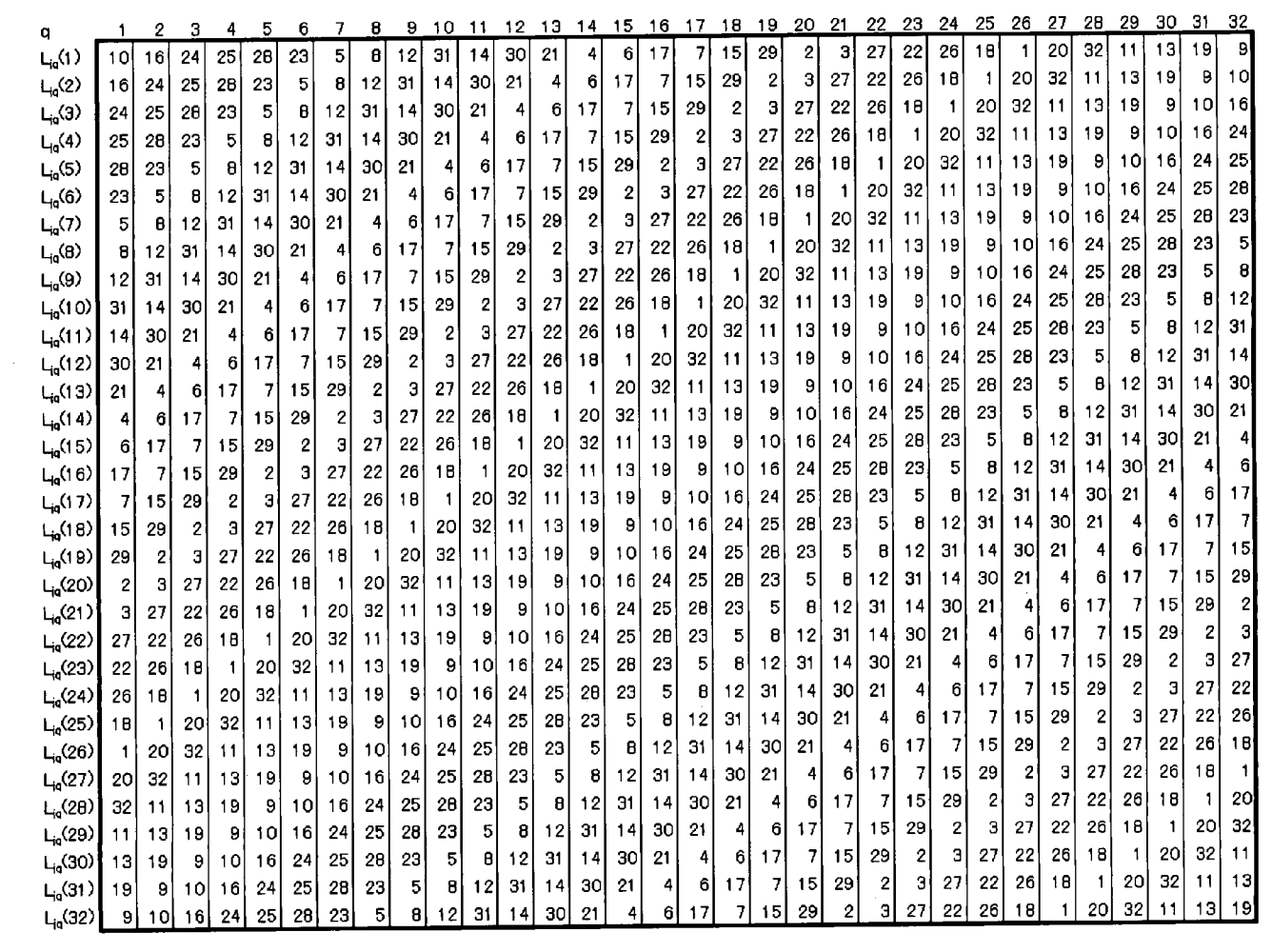

FIG. 20 is an illustration of Latin square sequences $L_{jq}$ (i). The Latin square sequences $L_{jq}$ (i) are used to determine a division pattern of the j×32+q-th column of the matrix to be expanded (for example, the matrix shown in FIG. 12). For example, the 670-th column $g_{670}$ (I) of the Euclid geometric codes EG $(2,2^5)$ to be shortened by deletion is determined as follows:

$g_{670}$ (I)={28 48 84 113 153 220 225 234 268 280 283 284 322 363 374 436 497 507 525 593 600 617 623 625 644 670 701 783 805 818 892 929}

This is divided into five columns of the weight 6 and one column of the weight 2. The corresponding Latin square $L_{jq}$ (i) is 20×32+30=670. Therefore, the following Latin square is obtained:

$L_{21, 30}$ (i)={13 19 9 10 16 24 25 28 23 5 8 12 31 14 30 21 4 6 17 7 15 29 2 3 27 22 26 18 1 20 32 11}

As a result, the division pattern becomes as follows:

$$g_{670,1}(l) = g_{670}(L_{21,30}(l))$$
$$= \{322 \quad 525 \quad 268 \quad 280 \quad 436 \quad 625\} \quad i=1, 2, \ldots, 6$$

$$g_{670,2}(l) = g_{670}(L_{21,30}(l))$$
$$= \{644 \quad 783 \quad 623 \quad 153 \quad 234 \quad 284\} \quad i=7, 8, \ldots, 12$$

$$g_{670,3}(l) = g_{670}(L_{21,30}(l))$$
$$= \{892 \quad 363 \quad 818 \quad 600 \quad 113 \quad 220\} \quad i=13, 14, \ldots, 16$$

$$g_{670,4}(l) = g_{670}(L_{21,30}(l))$$
$$= \{497 \quad 225 \quad 374 \quad 805 \quad 48 \quad 84\} \quad i=17, 18, \ldots, 24$$

$$g_{670,5}(l) = g_{670}(L_{21,30}(l))$$
$$= \{701 \quad 617 \quad 670 \quad 507 \quad 28 \quad 593\} \quad i=25, 26, \ldots, 30$$

$$g_{670,6}(l) = g_{670}(L_{21,30}(l))$$
$$= \{929 \quad 283\} \quad i=31, 32$$

Figure 21:
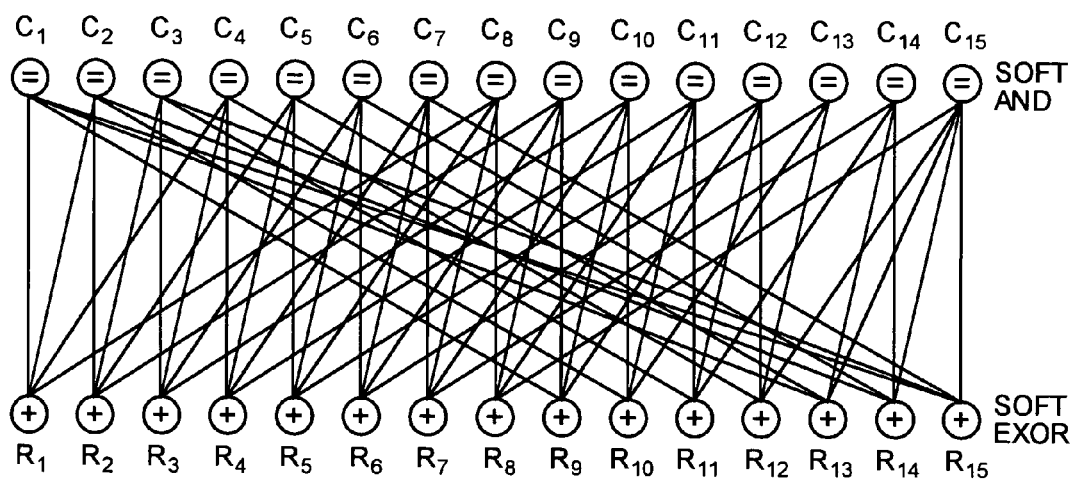
FIG. 21 is an illustration of LDPC codes shown in FIG. 29 expressed by a bipartile graph.
Figures 29, 30:
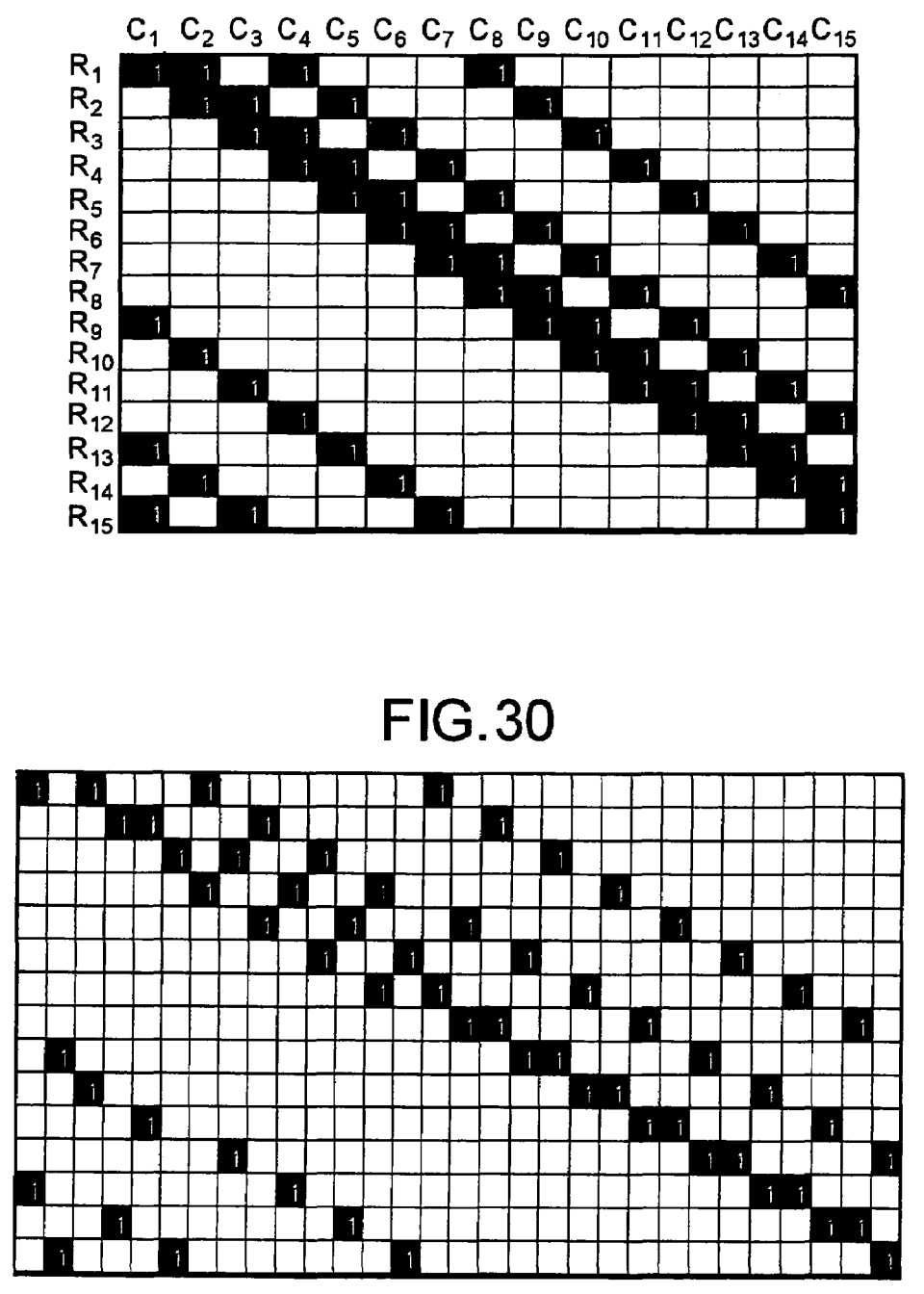

As a second embodiment of the present invention the LDPC codes (i.e., the check matrixes for LDPC codes) are expressed by a bipartile graph (that is, a tanner graph consisting of two kinds of elements of soft AND, and soft EXOR) as a general expression method, for example. FIG. 21 is an exemplary diagram of LDPC codes shown in FIG. 29 expressed by a bipartile graph. As shown in this diagram, the variable node is expressed by the soft AND, and the check node is expressed by the soft EXOR on the bipartile graph.

Figures 22, 23:
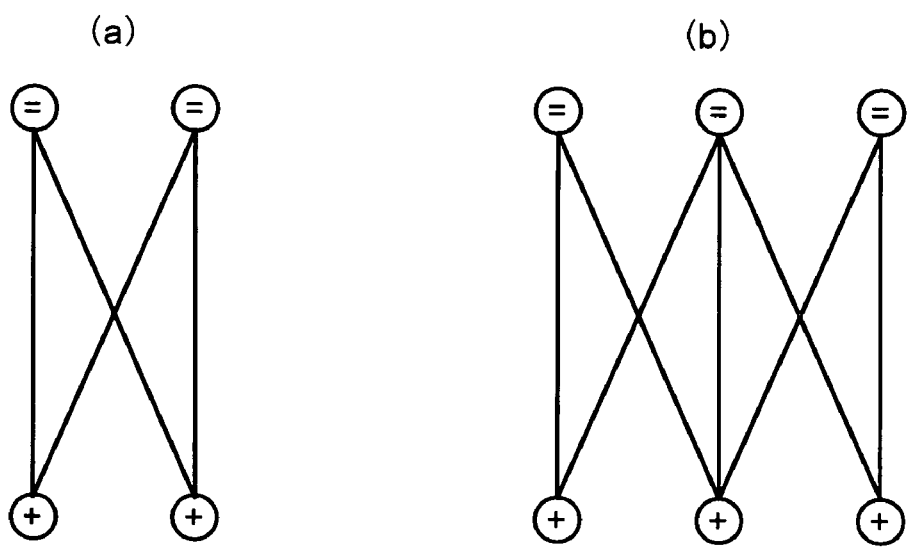
FIG. 22 is an exemplary diagram of a cycle 4 and a cycle 6.
FIG. 23 is an illustration of a row number of "1" in each column in the Euclid geometric codes EG (2, $2^2$) shown in FIG. 3.

In the coding/decoding using the LDPC codes, in general, when there are smaller number of a cycle 4, a cycle 6, and higher cycles on the bipartite graph, more satisfactory characteristics can be obtained. FIG. 22 is an exemplary diagram of a cycle 4 and a cycle 6.

Particularly, as elements that degrade the characteristics, the cycle 4 has the largest influence. When the cycle number becomes larger, the influence becomes smaller. Accordingly, for the LDPC codes, a structure that restrict the generation of small cycles like the cycle 4 and the cycle 6 is preferable.

In the method of generating check matrixes for LDPC codes according to the second embodiment, decoding characteristics are improved by deleting the cycle 6 that exists in the Euclid geometric. codes. The cycle 4 does not exist in the base Euclid geometric codes, and the characteristics are not changed even if rows and columns are divided or deleted (including the division and deletion according to the first embodiment).

FIG. 23 is an illustration of a row number of "1" in each column in the Euclid geometric codes EG $(2, 2^2)$ shown in FIG. 3. This matrix is expressed as col (i, j). In col (i, j), a polynomial W(X) that expresses the position of "1" in col (i, j) can express the top row as shown in the following equation (17):

$$W(X) = X^{1-1}30\ X^{3-1} + X^{4-1} + X^{12-1} \quad (17)$$

The Euclid geometric codes can be expressed in a format having this one polynomial cyclically shifted, as given by the following equation (18):

$$W(X) = X^{(i-1)mod(2^{2s}-1)} + X^{((i+2)-1)mod(2^{2s}-1)} + X^{((i+3)-1)mod(2^{2s}-1)} + X^{((i+11)-1)mod(2^{2s}-1)}, \text{ where } i=1, 2, \ldots, 2^{2s}-1 \quad (18)$$

To delete the cycle number 6 that exists in the Euclid geometric codes, the column weight is separated from 4 into 2. In other words, the equation (18) is separated into the former part and the later part, as given by the following equation (19):

$$W_1(X) = X^{(i-1)mod(2^{2s}-1)} + X^{((i+2)-1)mod(2^{2s}-1)}, i=1, 2, \ldots, 2^{2s}-1$$

$$W_2(X) = X^{((i+3)-1)mod(2^{2s}-1)} + X^{((i+11)-1)mod(2^{2s}-1)}, i=1, 2, \ldots, 2^{2s}-1 \quad (19)$$

FIG. 24 is an illustration of a matrix when the weight of the column is 2 by separating the matrix shown in FIG. 23 according to the expression (19). This matrix is expressed as cols_s2 (i, j). The LDPC codes corresponding to the matrix shown in FIG. 24 separated by the above processing have no cycle 6 at all. The separation based on the polynomial may be a pair of degrees. In other words, the matrix may be separated using the following equation (20):

$$W_1(X) = X^{(i-1)mod(2^{2s}-1)} + X^{((i+3)-1)mod(2^{2s}-1)}, i=1, 2, \ldots, 2^{2s}-1$$

$$W_2(X) = X^{((i+2)-1)mod(2^{2s}-1)} + X^{((i+11)-1)mod(2^{2s}-1)}, i=1, 2, \ldots, 2^{2s}-1 \quad (20)$$

As explained above, when the Euclid geometric codes have the weight 4, the column weight can be separated from 4 into 2 using the equation (19) or the equation (20), thereby to completely remove the cycle 6. However, the cycle 6 can be completely removed when all the weight of the column is separated into 2. Therefore, when there is already other column having the weight equal to or more than 3, that is, in the case of the "Irregular-LDPC Codes", the cycle 6 can be removed but can not be removed completely.

FIG. 25 is an illustration of a matrix col_s2_4 (i, j) when the weight of the matrix col (i, j) is simply separated into former two columns and latter two columns as a procedure to separate a column having the weight 4 into 20 columns having the weight 2 and 5 columns having the weight 4. In the matrix cols_s2_4 (i, j) shown in FIG. 25, the number of the cycle 6 becomes 35. On the other hand, FIG. 26 is an illustration of a matrix col_s2_4' (i, j) when the column is separated based on the above equation. In the matrix col_s2_4' (i, j) shown in FIG: 26, the number of the cycle 6 becomes 33, which is smaller than the number shown in FIG. 25.

As explained above, according to the present embodiment, the weight of the column is separated to decrease the number of the cycle 6 that exists in the Euclid geometric codes and that becomes the element of the characteristic degradation. Therefore, the decoding characteristics can be improved.

In the first and second embodiments, the Euclid geometric codes are used as the basic codes (i.e., the basic matrix). However, a matrix other than the Euclid geometric codes, such as, projective geometric codes, may also be used if it fulfills the conditions that "the weights of a row and a column are constant" and that "the number of cycle is equal to or more than six".

As explained above, according to the present invention, a definite and characteristic-stabilized check matrix for "irregular-LDPC Codes" can be generated easily in a short time corresponding to an optional ensemble, an optional code length, and an optional coding rate.

Moreover, the check matrix for "irregular-LDPC Codes" can be generated easily in a short time corresponding to an optional ensemble, an optional code length, and an optional coding rate.

Furthermore, the dividing is performed in higher precision.

Furthermore, the condition for code characteristics can be prescribed accurately.

Furthermore, the decoding characteristics can be improved substantially.

Although the invention has been described with respect to a specific embodiment for a complete and clear disclosure the appended claims are not to be thus limited but are to be construed as embodying all modifications and alternative constructions that may occur to one skilled in the art which fairly fall within the basic teaching herein set forth.

INDUSTRIAL APPLICABILITY

As explained above, the method of generating check matrixes for LDPC codes and the check matrix generation apparatus according to the present invention are useful for the communication system that employs the LDPC codes as error correction codes. Particularly, the method and the apparatus are suitable for an apparatus that generates definite and characteristic-stabilized "Irregular-LDPC Codes".

The invention claimed is:

1. A method of generating check matrixes for irregular-low-density parity-check codes, comprising:
   determining a maximum value of a column weight;
   determining a basic matrix that fulfills conditions that the weights of a row and a column are constant and that the number of cycle is equal to or more than six based on the maximum value of a column weight;
   determining a coding rate;
   searching an optimum ensemble of a row weight and a column weight according to a linear programming method in a state of a fixed coding rate, and so as to maximize a Gaussian noise;
   calculating an information length based on a predetermined block length and the coding rate;
   deleting a predetermined row based on the information length using the basic matrix; and carrying out a random division of a row or a column of the matrixes after the row deletion in a predetermined order.

2. The method according to claim 1, wherein
   the deleting includes dividing at random the weight of each row in the Euclid geometric codes based on the ensemble, subtracting the information length from a number of rows after the division, and then deleting a number of rows corresponding to the subtraction result while adjusting the ratio of each the weights in the ensemble.

3. The method according to claim 1, wherein the deleting includes deleting a predetermined number of rows from the basic Euclid geometric codes, and then dividing at random the weight of each row in the Euclid geometric codes after the deletion based on the ensemble.

4. The method according to claim 1, further comprising:
adjusting a weight distribution in the ensemble such that the total weight number of weight units is equal to an integer, and a sum of the total weight numbers of weight units is equal to the total number of "1"s in Euclid geometric codes, wherein the dividing is performed based on the adjusted ensemble.

5. The method according to claim 1, further comprising:
creating a Latin square of basic random sequences; and
dividing at random each column and each row by extracting a weight "1", from each row and each column in the Euclid geometric codes.

6. A method of generating check matrixes for irregular-LDPC codes using Euclid geometric codes, comprising:
determining a maximum value of a column weight;
determining Euclid geometric codes based on the maximum value of a column weight;
determining a coding rate;
searching an optimum ensemble of a row weight and a column weight according to a linear programming method in a state of a fixed coding rate, and so as to maximize a Gaussian noise;
calculating an information length based on a predetermined block length and the coding rate;
deleting a predetermined row based on the information length using the Euclid geometric codes; and
dividing at random a row or a column of the matrixes after the row deletion in a predetermined order.

7. The method according to claim 6, wherein
the deleting includes dividing at random the weight of each row in the Euclid geometric codes based on the ensemble, subtracting the information length from a number of rows after the division, and then deleting a number of rows corresponding to the subtraction result while adjusting the ratio of each the weights in the ensemble.

8. The method according to claim 6, wherein the deleting includes deleting a predetermined number of rows from the basic Euclid geometric codes, and then dividing at random the weight of each row in the Euclid geometric codes after the deletion based on the ensemble.

9. The method according to claim 6, further comprising:
adjusting a weight distribution in the ensemble such that the total weight number of weight units is equal to an integer, and a sum of the total weight numbers of weight units is equal to the total number of "1"s in Euclid geometric codes, wherein the dividing is performed based on the adjusted ensemble.

10. The method according to claim 6, further comprising:
creating a Latin square of basic random sequences; and
dividing at random each column and each row by extracting a weight "1" from each row and each column in the Euclid geometric codes.

11. A method of generating check matrixes for irregular-low-density parity-check codes, comprising:
dividing the weight of a row or a column in the basic matrix that fulfills conditions that the weights of a row and a column are constant and that the number of cycle is six or above using a predetermined polynomial; and
deleting a cycle number 6 that becomes an element of characteristic degradation.

12. A method of generating check matrixes for irregular-LDPC codes using Euclid geometric codes, comprising:
dividing the weight of a row or a column in the Euclid geometric codes using a predetermined polynomial; and
deleting a cycle number 6 that exists in the Euclid geometric codes and that becomes an element of characteristic degradation.

13. An apparatus that generates check matrixes for irregular-low-density parity-check codes, comprising:
a weight determination unit that determines a maximum value of a column weight;
a basic matrix determination unit that determines a basic matrix that fulfills conditions that the weights of a row and a column are constant and that the number of cycle is equal to or more than six based on the maximum value of a column weight;
a coding rate determination unit that determines a coding rate;
a weight searching unit that searches an optimum ensemble of a row weight and a column weight according to a linear programming method in a state of a fixed coding rate, and so as to maximize a Gaussian noise;
an information calculation unit that calculates an information length based on a predetermined block length and the coding rate;
a row deletion unit that deletes a predetermined row based on the information length using the basic matrix; and
a division unit that divides at random a row or a column of the matrixes after the row deletion in a predetermined order.

14. An apparatus that generates check matrixes for irregular-LDPC codes using Euclid geometric codes, comprising:
a weight determination unit that determines a maximum value of a column weight;
a Euclid geometric code determination unit that determines Euclid geometric codes based on the maximum value of a column weight;
a coding rate determination unit that determines a coding rate;
a weight searching unit that searches an optimum ensemble of a row weight and a column weight according to a linear programming method in a state of a fixed coding rate, and so as to maximize a Gaussian noise;
an information calculation unit that calculates an information length based on a predetermined block length and the coding rate;
a row deletion unit that deletes a predetermined row based on the information length using the Euclid geometric codes; and
a division unit that divides at random a row or a column of the matrixes after the row deletion in a predetermined order.

15. A communication apparatus that uses check matrixes for irregular-low-density parity-check codes, said check matrixes being generated by a method comprising:
determining a maximum value of a column weight;
determining a basic matrix that fulfills conditions that the weights of a row and a column are constant and that the number of cycles is equal to or more than six based on the maximum value of a column weight;
determining a coding rate;
searching an optimum ensemble of a row weight and a column weight according to a linear programming method in a state of a fixed coding rate, and so as to maximize a Gaussian noise;
calculating an information length based on a predetermined block length and the coding rate;
deleting a predetermined row based on the information length using the basic matrix; and carrying out a random division of a row column of the matrixes after the row deletion in a predetermined order.

* * * * *